United States Patent
Shareef et al.

(10) Patent No.: US 6,778,762 B1
(45) Date of Patent: Aug. 17, 2004

(54) SLOPED CHAMBER TOP FOR SUBSTRATE PROCESSING

(75) Inventors: Iqbal Shareef, Fremont, CA (US); Erez Shmuel, San Jose, CA (US); Syed Basha, Pleasanton, CA (US); Suwipin Martono, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 58 days.

(21) Appl. No.: 10/124,887

(22) Filed: Apr. 17, 2002

(Under 37 CFR 1.47)

(51) Int. Cl.[7] .................................................. F26B 19/00
(52) U.S. Cl. ........................ 392/416; 392/418; 219/390; 219/405; 219/411; 118/724; 118/725; 118/50.1
(58) Field of Search ................................ 219/390, 405, 219/411; 392/416, 418; 118/724, 725, 50.1

(56) References Cited

U.S. PATENT DOCUMENTS

| 5,179,677 | A | * | 1/1993 | Anderson et al. ............ 392/411 |
| 6,033,474 | A | * | 3/2000 | Mita et al. ..................... 118/58 |
| 6,246,030 | B1 | * | 6/2001 | Matsuyama .................. 219/390 |

* cited by examiner

*Primary Examiner*—Shawntina Fuqua
(74) *Attorney, Agent, or Firm*—Martine & Penilla, LLP

(57) ABSTRACT

A processing chamber top is provided. The chamber top includes a top surface and a bottom surface having an inner and an outer edge. The bottom surface is sloped downward from the inner edge to the outer edge. A central opening extends through the chamber top. In one embodiment, the downward slope is between about 10 degrees and about 20 degrees. A method for processing a wafer in a processing chamber and a method for uniformly heating a substrate in a processing chamber are also provided.

22 Claims, 6 Drawing Sheets

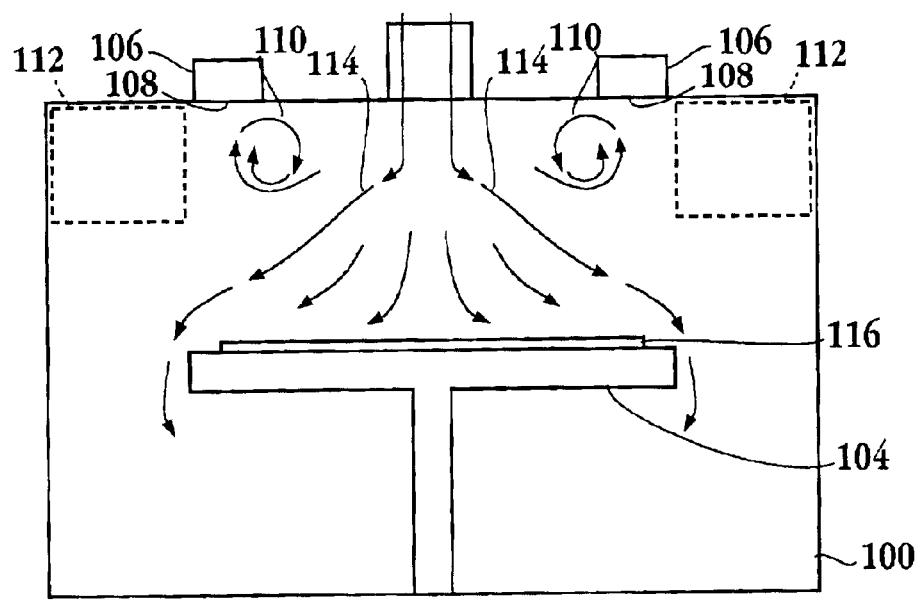
Fig. 1 *(prior art)*
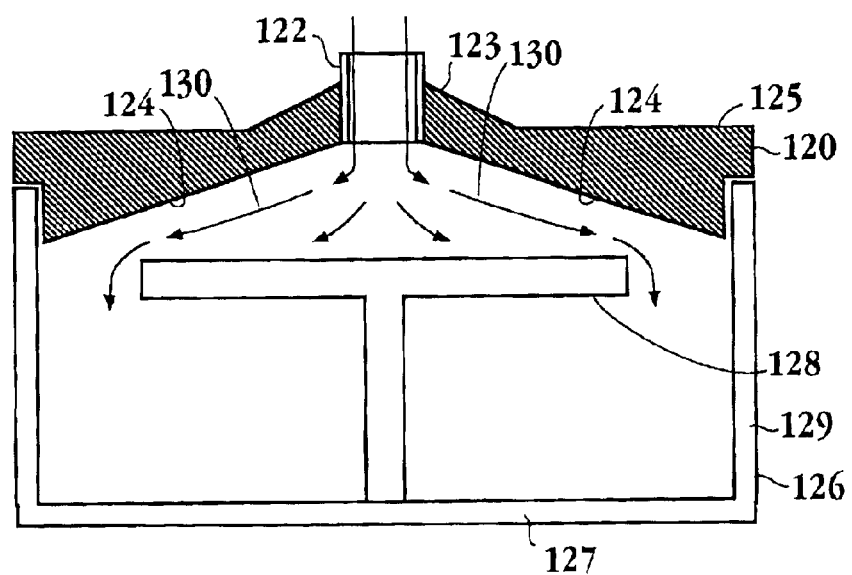
Fig. 2

SLOPED CHAMBER TOP FOR SUBSTRATE PROCESSING

BACKGROUND OF THE INVENTION

The present invention relates generally to semiconductor fabrication and more particularly, to a processing chamber that is configured to reduce re-circulation cells and dead zones in the process gas flow pathway and to enable uniform heating of a semiconductor substrate.

In the fabrication of semiconductor devices, a variety of processing operations are performed in processing chambers such as deposition chambers, etch chambers, cleaning chambers, etc. The design of the processing chambers used for these operations is defined by a flat top such that a cross sectional view of the processing chamber will be square or rectangular. The corner regions of the reaction chambers harbor re-circulation cells and dead zones where stagnant species can linger due to the fluid dynamics in the reaction chambers. Reactions between the stagnant species in the re-circulation cells and dead zones ultimately lead to the formation of particles during the processing operation. In turn, these particles can land on the surface of the substrate being processed which may ultimately lead to reduced yields and lower throughput.

FIG. 1 is a simplified schematic diagram of the airflow in a processing chamber having re-circulation cells and dead zones. Processing chamber 100 includes gas inlet 102, heating lamps 106 and substrate support 104. During processing operations, process gases flow through inlet 102 toward substrate 116, resting on substrate support 104, as indicated by arrows 114. The fluid dynamics inside chamber 100 lead to re-circulation zones 110 (also referred to as eddy currents) and dead zones 112. Re-circulation cells 110 have a long residence time leading to gas phase reactions and homogenous nucleation which results in particle formation. These particles tend to reside inside chamber 100 in areas that lack a purging fluid flow such as dead zones 112 and re-circulation zones 110. Eventually, the particles fall onto the surface of semiconductor substrate 116, thereby contaminating the semiconductor substrate.

Another shortcoming of the flat top reaction chambers is the uneven temperature distribution from heating lamps 106, which are disposed on the top of the chamber as shown in FIG. 1. Since the top center region of chamber 100 is used to introduce process gases over the surface of substrate 116, heating lamps 106 direct the radiation through windows 108 toward the edge of the substrate. As such, the temperature profile across semiconductor substrate 116 is uneven. In particular, the center region of semiconductor substrate 116 is cooler than the outer edge of the substrate. The temperature near the edge of the substrate can be greater than 10 degrees higher than the temperature at the center of the substrate. This temperature difference between the center region and an edge of the substrate is amplified as the semiconductor industry transitions from 200 millimeter wafers to 300 millimeter wafers. The non-uniform temperature profile impacts the process parameters, i.e., removal rate, etch rate deposition rate, etc. Consequently, a non-uniform temperature profile leads to a non-uniform processing rate.

One attempt to compensate for the temperature effect on a processing rate is to direct more of the process gas flow toward the center region of the substrate. Thus, the reaction rates at the center region are driven higher through the higher concentration of process gas, thereby attempting to equalize the increased reaction rates near the edge of the substrate due the higher temperature. However, the process gases are expensive and require treatment prior to release into the environment. Accordingly, it would be desirable to limit the amount of process gases consumed in the semiconductor fabrication operations.

In view of the foregoing, there is a need for reducing the occurrence of re-circulation cells and the dead zones within reaction chambers during semiconductor processing. In addition, there is a need to provide a substantially evenly distributed temperature profile across the surface of the semiconductor substrate during processing operations.

SUMMARY OF THE INVENTION

Broadly speaking, the present invention fills this need by providing a sloped top having a sloped surface that allows continuous purging of dead zones. Additionally, the orientation of heating lamps disposed over the sloped top provides for a substantially uniform temperature profile across a semiconductor substrate being heated.

In accordance with one aspect of the present invention, a chamber top is provided. The chamber top includes a top surface and a bottom surface having an inner and an outer edge. The bottom surface is sloped downward from the inner edge to the outer edge. A central opening extends through the chamber top. In one embodiment, the downward slope is between about 10 degrees and about 20 degrees.

In accordance with another aspect of the invention, a chamber for processing a semiconductor substrate is provided. The chamber includes a base having an edge. A sidewall extends from the edge of the base. A top is disposed over the sidewall. The top includes a top surface, a bottom surface having an inner edge and an outer edge, and a central opening extending therethrough. The bottom surface is sloped downward from the inner edge to the outer edge.

In accordance with yet another aspect of the invention, a method for processing a wafer in a process chamber is provided. The method includes the operation of flowing process gases along a surface configured to reduce stagnant species formed by gas phase reactions between process gases. In one embodiment, the surface is a sloped surface.

In accordance with still yet another aspect of the invention, a method for uniformly heating a substrate in a processing chamber is provided. The method initiates with affixing at least two heating lamps on a chamber top. The at least two heating lamps are affixed such that each of the at least two heating lamps are disposed over a window configured to allow heat energy into a processing chamber. Then, the at least two heating lamps are oriented such that an axis of each of the at least two heating lamps is directed toward a center region of a substrate in the processing chamber.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 1 is a simplified schematic diagram of the airflow in a conventional processing chamber that shows the re-circulation cells and dead zones that occur during processing.

FIG. 2 is a simplified cross sectional view of a processing chamber for a semiconductor substrate having a sloped top in accordance with one embodiment of the invention.

DETAILED DESCRIPTION OF EXEMPLARY EMBODIMENTS

Figure 3:
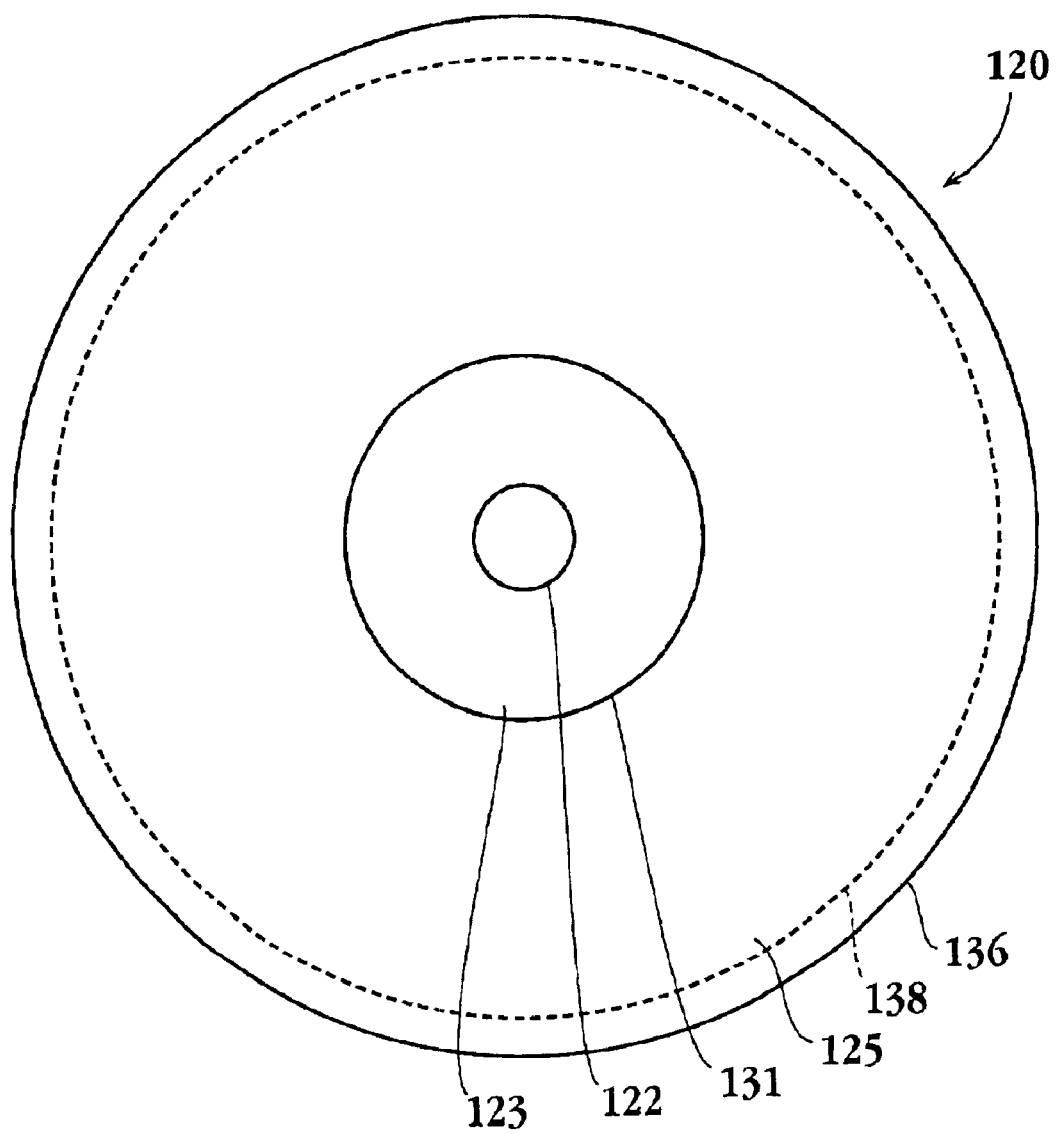
FIG. 3 is a top plan view of a sloped shaped top according to one embodiment of the invention.

Several exemplary embodiments of the invention will now be described in detail with reference to the accompanying drawings. FIG. 1 is discussed above in the "Background of the Invention" section.

The present invention provides a processing chamber having a sloped top. The sloped top of the processing chamber optimizes a gas flow into the processing chamber. That is, the sloped reactor walls of the sloped top substantially eliminate re-circulation and dead zones within the processing chamber. In turn, the gas phase recombination reactions of active species are minimized. The reduction in gas phase recombination reactions leads to a higher concentration of reactive species available to react on the semiconductor substrate surface. Consequently, the chemical efficiency of a processing chamber having a sloped top is enhanced as compared to a "flat top" design.

Additionally, heat lamps disposed over apertures extending through the sloped top, are oriented so that an axis of each heat lamp is directed toward a center region of the semiconductor substrate being processed. Accordingly, the temperature distribution across the semiconductor substrate is more uniform. In turn, the need to provide the center region of the semiconductor substrate with a higher gas flow to compensate for an uneven temperature distribution is avoided. Therefore, the increase in chemical efficiency in conjunction with the reduction in overcompensation of gas flow provided to the center region allow for a decrease in the consumption of process gases during semiconductor fabrication operations.

FIG. 2 is a simplified cross sectional view of a processing chamber for a semiconductor substrate having a sloped top in accordance with one embodiment of the invention. The processing chamber includes sloped top 120 disposed over bottom section 126. Bottom section 126 of the processing chamber includes a base 127 having a sidewall 129 extending upwardly therefrom. It should be appreciated that base 127 is circular in one embodiment. However, base 127 can be any suitable shape for a processing chamber. Semiconductor substrate support 128 is included in the interior of the processing chamber. Sloped top 120 includes a gas inlet 122 extending therethrough for the introduction of process gases into the processing chamber. Sloped top 120 also includes a top surface 125 that is substantially flat. In a center region of sloped top 120, top surface extension 123 inclines upward to gas inlet 122. As will be described in more detail below, top surface 125 of sloped top 120 can have any number of suitable configurations. Bottom surface 124 of sloped top 120 is sloped downward from gas inlet 122 to sidewall 129. Thus, a process gas introduced through inlet 122 flows into the processing chamber in a manner that substantially eliminates stagnant species. That is, the sloped configuration of bottom surface 124 efficiently channels the process gases into the processing chamber and does not allow the gas flow to re-circulate within the processing chamber in a region defined above semiconductor substrate support 128. As will be explained in more detail below, sloped top 120 optimizes the fluid dynamics inside the reaction chamber so that gas phase reactions and homogenous nucleation leading to particle formation are substantially eliminated. It should be appreciated that a cross sectional view of sloped top 120 yields a conical shape as shown in FIGS. 4 and 6–8.

FIG. 3 is a top plan view of a sloped shaped top according to one embodiment of the invention. Gas inlet 122 is located substantially in the center of sloped top 120. Top surface 125 is flat from outer edge 136 to top surface extension 123. Top surface extension 123 extends upward from the edge 131 to gas inlet 122. It will be apparent to one skilled in the art that top surface extension 123 can extend any distance from gas inlet 122. That is, top surface 125 of sloped top 120 may be sloped, flat or some combination thereof. It should be appreciated that top surface extension 123 increases the thickness of sloped top 120 in the vicinity of gas inlet 122 to provide support.

Figure 4:
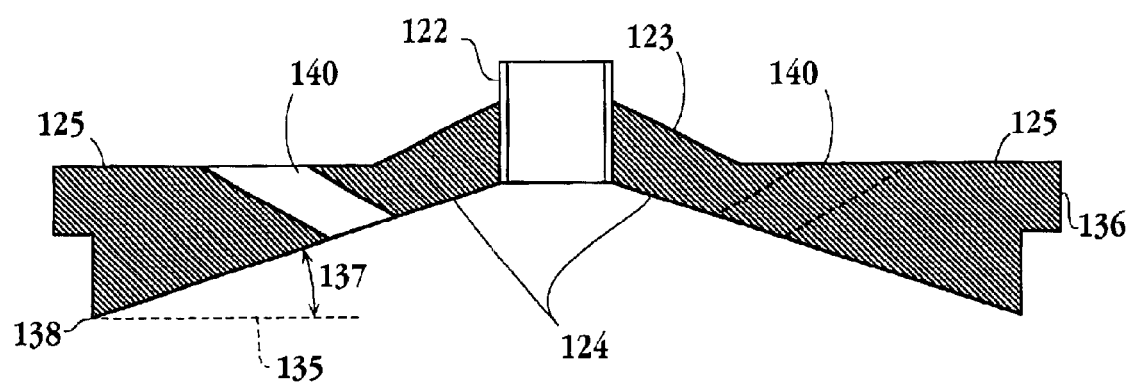
FIG. 4 is a cross-sectional view of a sloped top of a semiconductor processing chamber having apertures defined therethrough in accordance with one embodiment of the invention.

FIG. 4 illustrates a schematic diagram of a cross-sectional view of a sloped top of a semiconductor processing chamber having apertures defined therethrough in accordance with one embodiment of the invention. Gas inlet 122 extends through sloped top 120 to an inner edge of bottom surface 124. In one embodiment, gas inlet 122 has a constant diameter through sloped top 120. The sloped top includes a bottom surface 124 which is sloped downward from the inner edge of the bottom surface to outer edge 138. Thus, bottom surface 124 of sloped top 120 provides a sloped top to the processing chamber to eliminate dead zones. Angle 137 defines the downward angle of bottom surface 124 relative to plane 135. It should be appreciated that plane 135 is defined by points on outer edge 138. In one embodiment, angle 137 is between about 10 degrees and about 20 degrees, with an angle of about 15 degrees being preferred. As mentioned above, the downward slope of bottom surface 124, defined by angle 137, allows for a fluid flow pattern that defines a sweeping airflow inside the processing chamber and substantially eliminates re-circulation zones. Thus, as process gases are introduced through inlet 122, a constant purging fluid flow is supplied due to the geometry of the sloped top.

Still referring to FIG. 4, apertures 140 extend through sloped top 120. Apertures 140 allow access for heat energy from an external source, such as a heat lamp, to enter an inner region of the processing chamber, in order to heat a substrate within the processing chamber. In one embodiment, each aperture 140 includes a window configured to allow heat energy to enter the chamber while isolating the chamber to maintain a clean environment inside the chamber. It should be appreciated that while the sloped top of FIG. 4 is shown as having flat top surface 125 to which an external heating source, such as a heating lamp, can be attached, top surface 125 can be sloped as described with reference to FIGS. 6 and 7. As will be explained in more detail below, by orienting the heat lamps such that an axis of each of the heat lamps is directed toward a center region of a substrate being heated in the processing chamber, the heating profile of the substrate becomes more uniform. In one embodiment, the sloped top includes 5 apertures equally spaced as described with reference to FIGS. 5 and 6. However, it should be appreciated that any suitable number of apertures 140 with associated windows may be included in the sloped top.

Figure 5:
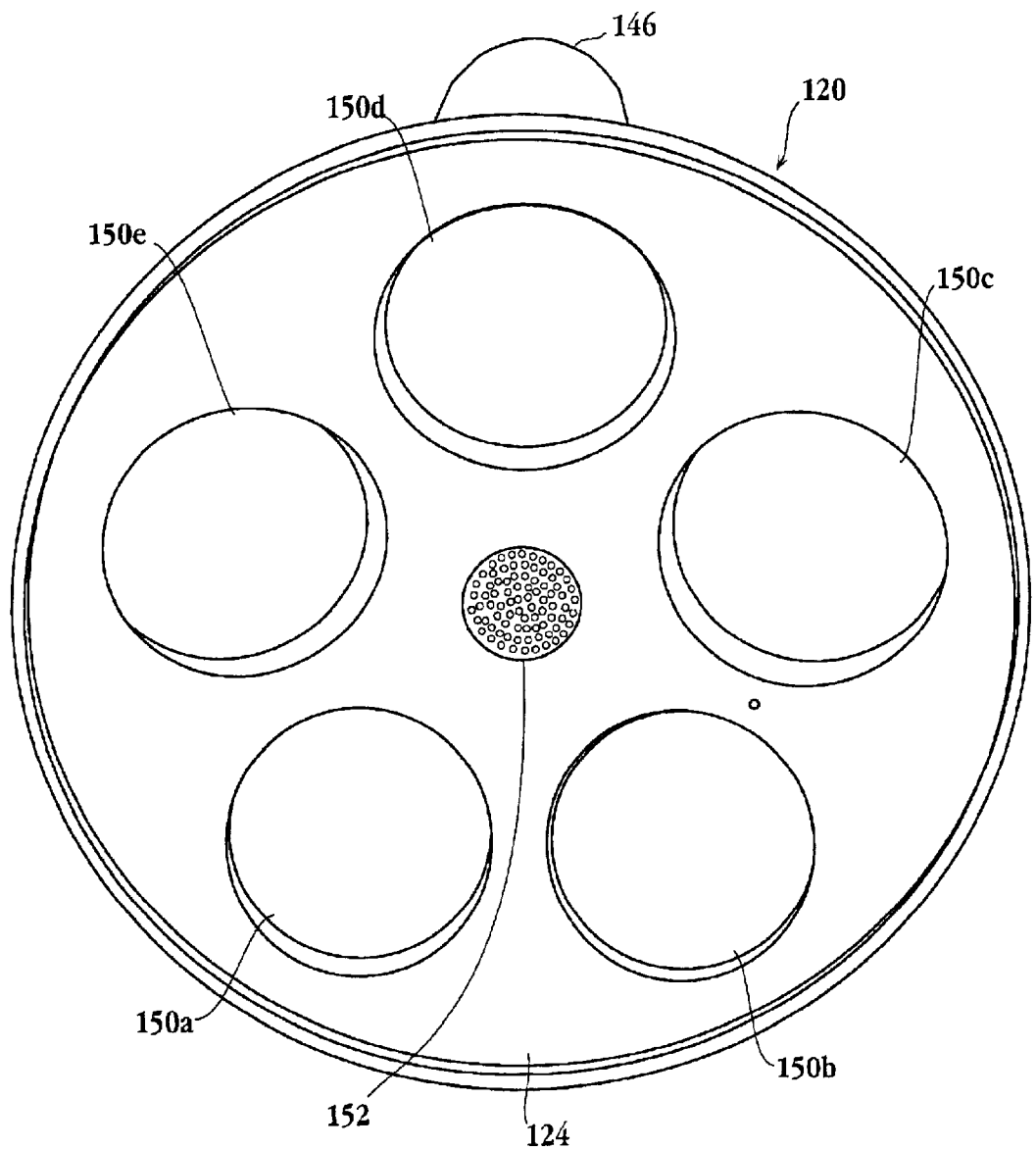
FIG. 5 is a bottom perspective view of a sloped chamber top in accordance with one embodiment of the invention.
Figure 6:
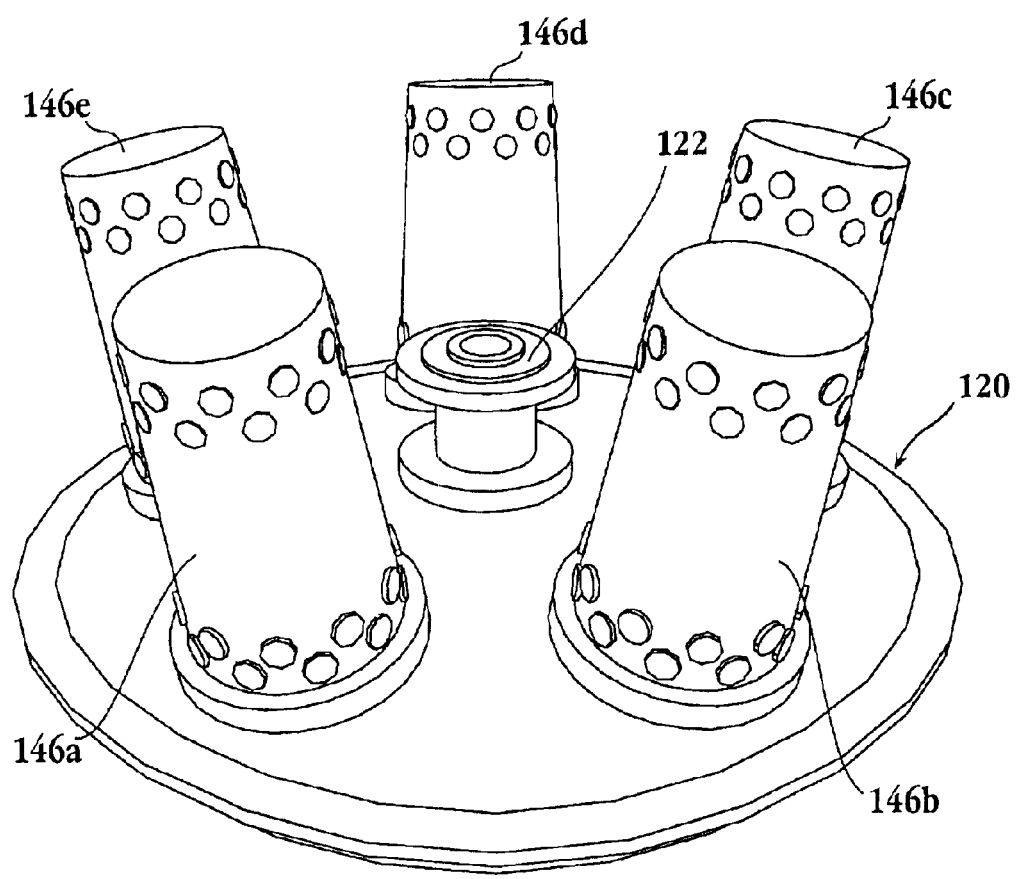
FIG. 6 is a top perspective view of a sloped chamber top with heat lamps in accordance with one embodiment of the invention.

FIG. 5 is a bottom perspective view of a sloped chamber top in accordance with one embodiment of the invention. Bottom surface 124 includes apertures for five windows, 150a through 150e, substantially equally spaced around the center of sloped top 120. As shown in FIG. 6, heat lamps 146 are disposed over each aperture. In one embodiment, windows 150a through 150e are made from quartz or sapphire. Process gases are introduced into the processing chamber through nozzle 152. Nozzle 152 can be any suitable nozzle for introducing process gases into the processing chamber. In one embodiment, nozzle 152 is a hemispherical showerhead as described in U.S. application Ser. No. 10/017,100, entitled "Reduced Footprint Showerhead for Distributing Gases in a Process Chamber" and filed on Dec. 12, 2001. This application is hereby incorporated by reference. It should be appreciated that five windows are shown for illustrative purposes only and is not meant to be limiting, as sloped top 120 can include any suitable number of windows 150, and associated heat lamps 146, to provide a substantially uniform temperature profile across a semiconductor substrate being heated. Additionally, the bottom surfaces of windows 150a through 150e can be either slightly recessed from bottom surface 124 or flush with bottom surface 124.

FIG. 6 is a top perspective view of a sloped chamber top with heat lamps in accordance with one embodiment of the invention. Heat lamps 146a through 146e are disposed on sloped chamber top 120. It should be appreciated that each of heating lamps 146a through 146e is disposed over an aperture, such as apertures 150a through 150e, respectively, of FIG. 5. In one embodiment, heating lamps 146a through 146e are configured to supply infrared heat energy to heat a semiconductor substrate within a processing chamber. Accordingly, each of heating lamps 146a through 146e can be controlled through a control loop providing feedback on the temperature of a semiconductor substrate in the processing chamber, in order to maintain the semiconductor substrate at a substantially uniform temperature. Heating lamps 146a through 146e are substantially equally spaced over sloped top 120. Gas inlet 122 is substantially centered on sloped top 120 in one embodiment. As mentioned above with reference to FIG. 5, any suitable number of heating lamps 146 may be disposed over sloped top 120.

Figure 7:
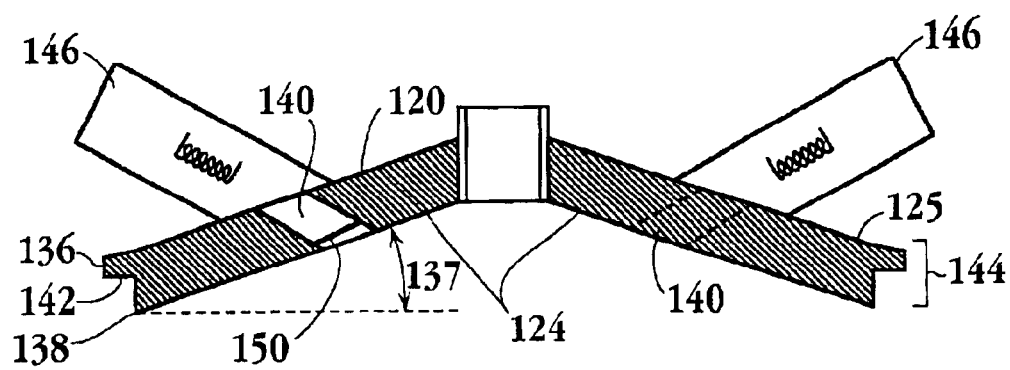
FIG. 7 is a cross sectional view of a sloped top having a substantially uniform thickness in accordance with one embodiment of the invention.

FIG. 7 is a cross sectional view of a sloped top having a substantially uniform thickness in accordance with one embodiment of the invention. Here, top surface 125 and bottom surface 124 of sloped top 120 are substantially parallel. Thus, thickness 144 of sloped top 121 is substantially uniform. It should be appreciated that outer edge 136 of top surface 125 extends past outer edge 138 of bottom surface 124. Thus, a shoulder 142 is defined in one embodiment of the invention. One skilled in the art will appreciate that shoulder 142 allows sloped top 120 to be disposed over a bottom section of a processing chamber, such as bottom section 126 with reference to FIG. 2. Sloped top 120 can be affixed to a bottom section of a processing chamber through any suitable manner well known in the art. One skilled in the art will appreciate that heat lamps 146 provide heat energy to a semiconductor substrate within a processing chamber in order for the processing to occur at an elevated temperature, as is common with processes such as photoresist stripping, ashing, etc. Heat lamps 146 are oriented so that an axis of each heat lamp is directed toward a center region of a semiconductor substrate positioned below sloped top 120 in a processing chamber as will be further described with reference to FIG. 8. While the cross sectional view of FIG. 7 shows two visible apertures 140 each having a heat lamp 146, one skilled in the art will appreciate that any suitable number of apertures and heat lamps disposed thereover can be included.

Figure 8:
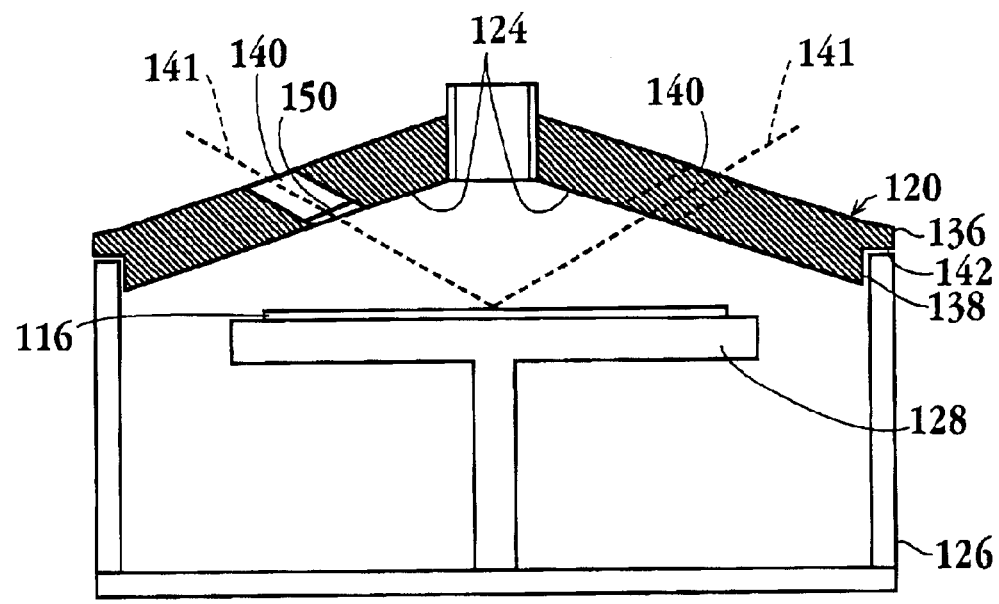
FIG. 8 is a simplified cross sectional view of a processing chamber having a sloped top with apertures defined therethrough in accordance with one embodiment of the invention.

FIG. 8 is a simplified cross sectional schematic diagram of a processing chamber having a sloped top with apertures defined therethrough in accordance with one embodiment of the invention. Window 150 isolates the processing chamber from external sources of contamination. Substrate 116 is supported on substrate support 128 within the processing chamber. In one embodiment, heat lamps, such as heat lamps 146 discussed with reference to FIGS. 6 and 7, are oriented so that the heat flux emanating from the heat lamps is directed along axis 141 toward a center region of substrate 116. In turn, the heating profile across substrate 116 is substantially uniform due to the orientation of the heat lamps. In one embodiment, heat lamps 146 emit infrared energy to heat substrate 116. In a preferred embodiment, sloped top 130 has five, substantially equally spaced, apertures 140 defined around the center of the sloped top, with each aperture a having heat lamp 146 disposed thereover. Sloped top 120 is made from a suitable material compatible with the processing operations, i.e., etching, deposition, ashing, photoresist stripping, etc., occurring within the processing chamber. In one embodiment, sloped top 120 is formed from aluminum.

Still referring to FIG. 8, outer edge 136 of top surface 125 extends past outer edge 138 of bottom surface 124, thereby creating a shoulder 142. Shoulder 142 allows sloped top 120 to rest on a sidewall of bottom section 126. As mentioned above, sloped top 120 can be affixed to bottom section 126 in any suitable manner. It should be appreciated that the orientation of heat lamps 146 to provide a substantially uniform temperature profile allows for a reduction in process gas consumption. That is, the substantially even temperature profile across substrate 116, eliminates the need to overcompensate a center region of the substrate with process gases. Furthermore, the geometry of sloped top 120 allows for the substantial elimination of re-circulation zones in dead zones within the processing chamber. Therefore, more of the inlet gas is available to react or perform the processing operation at a surface of the substrate 116, thereby augmenting the efficient use of the process gases. It will be apparent to one skilled in the art that the geometry of sloped top 120 along with the orientation of the heat lamps provides a substantially uniform temperature profile across the semiconductor substrate and will therefore reduce the consumption of process gasses.

In summary, the present invention provides a sloped top for a processing chamber to allow for a continuous purge of dead zones, thereby substantially eliminating stagnant species. In addition, heating lamps, disposed over apertures defined through the sloped top, are oriented such that a temperature profile across a semiconductor substrate within the processing chamber is substantially uniform. The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A chamber top, comprising:

a top surface including at least two apertures extending through the chamber top, the at least two apertures located between the central opening and an outer edge of the top surface wherein an axis of each of the at least two apertures is angled inwardly toward a center of the chamber top;

a bottom surface having an inner edge and an outer edge, and a central opening extending therethrough, wherein the bottom surface is sloped downward from the inner edge to the outer edge.

2. The chamber top of claim 1, wherein the chamber top is formed from aluminum.

3. The chamber top of claim 1, wherein heating elements are affixed to the top surface over each of the at least two apertures.

4. The chamber top of claim 1, wherein an angle defined between the bottom surface and a horizontal plane defined by points on the outer edge of the bottom surface is between about 10 degrees and about 20 degrees.

5. The chamber top of claim 4, wherein the angle is about 15 degrees.

6. The chamber top of claim 1, wherein an outer edge of the top surface extends past the outer edge of the bottom surface to define a shoulder.

7. The chamber top of claim 1, wherein each of the at least two apertures contains a window, the window comprised of a material selected from one of sapphire and quartz.

8. A chamber for processing a semiconductor substrate, the chamber comprising:

a base;

a sidewall extending upwardly from the base; and a top disposed on the sidewall, the top including;

a top surface including at least two apertures extending through the chamber top, the at least two apertures located between the central opening and an outer edge of the top surface wherein an axis of each of the at least two apertures is angled inwardly toward a center of the chamber top;

a bottom surface having an inner edge and an outer edge, and a central opening extending therethrough, wherein the bottom surface is sloped downward from the inner edge to the outer edge.

9. The chamber of claim 8, wherein an angle defined between the bottom surface and a horizontal plane defined by the points on the outer edge of the bottom surface is between about 10 degrees and about 20 degrees.

10. The chamber of claim 9, wherein the angle is about 15 degrees.

11. The chamber of claim 8, wherein the base is circular.

12. The chamber of claim 8, wherein an outer edge of the top extends past the outer edge of the bottom surface to define a shoulder.

13. The chamber of claim 12, wherein the shoulder is configured to integrate with a top surface of the sidewall.

14. A method for processing a wafer in a process chamber, the method comprising:

introducing process gases into a gas inlet extending through a center region of a top of a processing chamber;

flowing the process gases along a downward sloped bottom surface of the top of the processing chamber extending from the gas inlet, the bottom surface configured to reduce stagnant species formed by gas phase reactions between process gases.

15. The method as recited in claim 14, wherein the introducing process gases into a gas inlet extending through a center region of a top of a processing chamber includes, introducing the process gasses through a hemispherical showerhead.

16. The method as recited in claim 15, wherein the surface is sloped downward from the gas inlet.

17. The method as recited in claim 16, wherein the surface slopes downward at an angle between about 10 degrees and 20 degrees relative to a horizontal plane defined by points on an outer edge of the surface.

18. A method for uniformly heating a substrate in a processing chamber, the method comprising:

providing at least two heating lamps on a sloped chamber top, each of the at least two heating lamps is disposed over a window defined within the sloped chamber top, the window configured to allow heat energy into a processing chamber;

aligning an axis of each of the at least two heating lamps with an axis of the corresponding window, the axis of each of the at least two heating lamps and the axis of each corresponding window defining a heat projection axis which is directed toward a center region of a substrate in the processing chamber; and projecting non-reflected heat energy from the at least two heating lamps along the heat projection axis.

19. The method as recited in claim 18, wherein the window is comprised of a material selected from the group consisting of sapphire and quartz.

20. The method as recited in claim 18, wherein the heat energy is infrared heat energy.

21. A chamber top, comprising:

a top surface;

at least two apertures extending through the chamber top, each of the at least two apertures having an axis that is angled inwardly toward a center of a substrate disposed in a processing chamber over which the chamber top sets; and a bottom sloped surface configured to substantially eliminate re-circulation cells and dead zones in a process gas flow pathway.

22. The chamber top of claim 21, wherein each of the at least two apertures contains a window, the window comprised of a material selected from one of sapphire and quartz.

* * * * *